(12) United States Patent
Hoei

(10) Patent No.: US 8,289,779 B2
(45) Date of Patent: Oct. 16, 2012

(54) MEMORY CELL SENSING DEVICE EQUIPPED WITH A RAMP VOLTAGE GENERATOR USING A DIGITAL-TO-ANALOG CONVERTER (DAC) AND COUNTERS, AND SENSING METHODS THEREOF

(75) Inventor: Jung-Sheng Hoei, Newark, CA (US)

(73) Assignee: Micron Technology, Inc., Boise, ID (US)

( * ) Notice: Subject to any disclaimer, the term of this patent is extended or adjusted under 35 U.S.C. 154(b) by 199 days.

(21) Appl. No.: 12/751,575

(22) Filed: Mar. 31, 2010

(65) Prior Publication Data
US 2011/0242900 A1 Oct. 6, 2011

(51) Int. Cl.
*G11C 16/26* (2006.01)
(52) U.S. Cl. ......... 365/185.21; 365/185.22; 365/185.19; 365/185.17; 365/185.03; 365/185.33
(58) Field of Classification Search ............. 365/185.03, 365/185.17, 185.19, 185.21, 185.22, 185.23, 365/185.33
See application file for complete search history.

(56) References Cited

U.S. PATENT DOCUMENTS

| | | | |
|---|---|---|---|
| 7,224,611 B2 * | 5/2007 | Yamamoto et al. | 365/185.21 |
| 2007/0159888 A1 | 7/2007 | Tu et al. | |
| 2009/0021987 A1 | 1/2009 | Sarin et al. | |
| 2009/0141558 A1 | 6/2009 | Sarin et al. | |
| 2009/0231926 A1 | 9/2009 | Sarin et al. | |
| 2010/0302881 A1 * | 12/2010 | Kim et al. | 365/189.16 |

\* cited by examiner

*Primary Examiner* — Andrew Q Tran
(74) *Attorney, Agent, or Firm* — Brooks, Cameron & Huebsch, PLLC

(57) ABSTRACT

The present disclosure includes methods, devices, and systems for sensing memory cells. One or more embodiments include providing an output of a first counter to a digital-to-analog converter (DAC). An output of the DAC can correspond to a ramping voltage provided to a control gate of the memory cell. An output of a second counter can be provided to sensing circuitry coupled to a sense line of the memory cell. Conduction of the sense line in response to the ramping voltage can be sensed, and an output value of the second counter can be determined in response to the sensed conduction of the sense line.

29 Claims, 5 Drawing Sheets

MEMORY CELL SENSING DEVICE EQUIPPED WITH A RAMP VOLTAGE GENERATOR USING A DIGITAL-TO-ANALOG CONVERTER (DAC) AND COUNTERS, AND SENSING METHODS THEREOF

TECHNICAL FIELD

The present disclosure relates generally to semiconductor memory devices, methods, and systems, and more particularly, to memory cell sensing devices and methods.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored information when not powered and can include NAND flash memory, NOR flash memory, read only memory (ROM), Electrically Erasable Programmable ROM (EEPROM), Erasable Programmable ROM (EPROM), and phase change random access memory (PCRAM), among others.

Various types of memory can be used in memory systems. For example, Flash memory can be part of a memory system as internal memory or as removable memory that can be coupled to the memory system through an interface via a format such as USB (universal serial bus), MMC (multi media card), CF (compact flash), or SD (secure digital), among others. Flash memory devices, including floating gate flash devices and charge trap flash (CTF) devices, may be utilized as non-volatile memory for a wide range of electronic applications. Flash memory devices typically use a one-transistor memory cell that allows for high memory densities, high reliability, and low power consumption.

Uses for flash memory include memory for sold state drives (SSDs), personal computers, personal digital assistants (PDAs), digital cameras, cellular telephones, portable music players, e.g., MP3 players, and movie players, among others. Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to (and in some cases form) an access line (e.g., a word line as commonly referred to in the art). However each memory cell is not directly coupled to a sense line (e.g., a bit line as commonly referred to in the art) by its drain. Instead, the memory cells of the array are coupled together in series, source to drain, between a common source and a bit line, where the memory cells commonly coupled to a particular bit line are referred to as a "column".

Sensing operations, such as read operations and program verify operations, can involve providing a potential to a control gate of a selected memory cell and determining whether or not the cell conducts (e.g., based on sensed conduction of the sense line coupled to the selected cell). For MLCs (e.g., memory cells configured to store multiple bits of data), such a sensing operation can require the application of multiple potentials. For example, an MLC capable of being programmed to sixteen states (e.g., a 4-bit cell) can require the application of fifteen different discrete potentials to the control gate to sense the state of the cell. Each potential provided to the control gate is provided for a period of time (e.g., 10 to 20 microseconds), while the sense line carrying the current settles. As such, sensing a 4-bit cell may require the application of fifteen different sensing potentials, which can result can in a 300 microsecond sensing time.

Some sensing operations include the use of a voltage ramp provided to the control gate of the selected cell, rather than discrete sensing voltages. However, such sensing operations can result in erroneous data determinations due to factors such as variations in ramp rate and distortions in ramp value that can occur with process cycling and changing temperature, for example. Also, non-linearity at end portions of the provided ramping voltage, as well as transient effects of the RC (resistor-capacitor) constant associated with word lines and/or bit lines may prevent accurate sensing of the selected cell.

DETAILED DESCRIPTION

Figure 1:
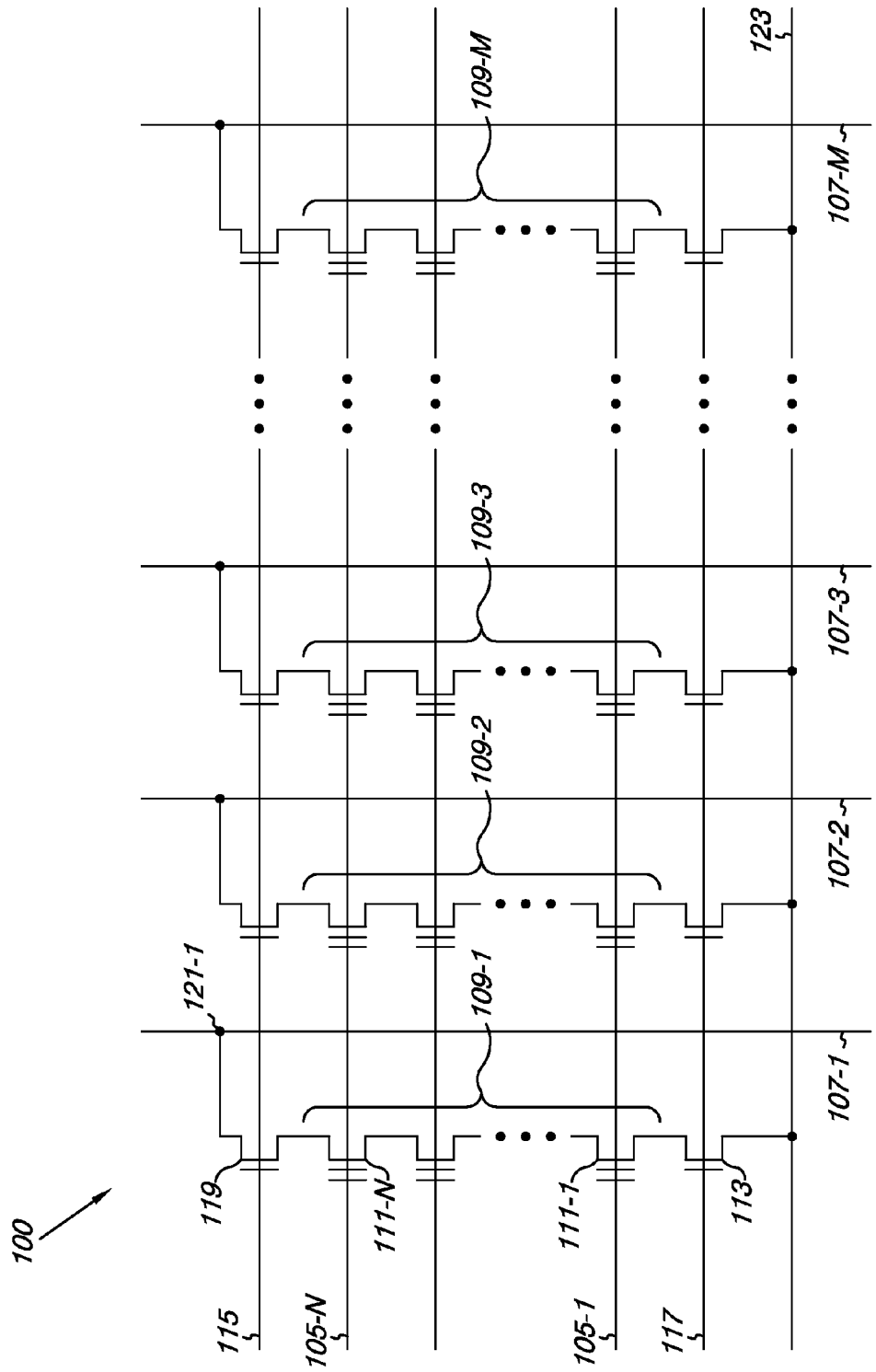
FIG. 1 is a schematic of a portion of a non-volatile memory array that can be operated in accordance with one or more embodiments of the present disclosure.

The present disclosure includes methods, devices, and systems for sensing memory cells. One or more embodiments include providing an output of a first counter to a digital-to-analog converter (DAC). An output of the DAC can correspond to a ramping voltage provided to a control gate of the memory cell. An output of a second counter can be provided to sensing circuitry coupled to a sense line of the memory cell. Conduction of the sense line in response to the ramping voltage can be sensed, and an output value of the second counter can be determined in response to the sensed conduction of the sense line.

One or more embodiments of the present disclosure provide improved memory cell sensing as compared to previous approaches. For instance, embodiments of the present disclosure can provided benefits such as reduced power consumption, reduced physical foot print, and a reduced likelihood of sensing errors, as compared to previous memory cell sensing approaches, among other benefits.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "M," "N," and "P," particularly with respect to reference numerals in the drawings, indicates that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 105 may reference element "05" in FIG. 1, and a similar element may be referenced as 405 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a schematic of a portion of a non-volatile memory array 100 that can be operated in accordance with one or more embodiments of the present disclosure. The embodiment of FIG. 1 illustrates a NAND architecture non-volatile memory. However, embodiments described herein are not limited to this example. As shown in FIG. 1, the memory array 100 includes access lines (e.g., word lines 105-1, ..., 105-N) and corresponding sense lines (e.g., local bit lines 107-1, 107-2, 107-3, ..., 107-M). For ease of addressing in the digital environment, the number of word lines 105-1, ..., 105-N and the number of local bit lines 107-1, 107-2, 107-3, ..., 107-M can be some power of two (e.g., 256 word lines by 4,096 bit lines).

Memory array 100 includes NAND strings 109-1, 109-2, 109-3, ..., 109-M. Each NAND string includes non-volatile memory cells 111-1, ..., 111-N, each associated with a respective word line 105-1, ..., 105-N. Each NAND string (and its constituent memory cells) is also associated with a local bit line 107-1, 107-2, 107-3, ..., 107-M. The non-volatile memory cells 111-1, ..., 111-N of each NAND string 109-1, 109-2, 109-3, ..., 109-M are connected in series source to drain between a source select gate (SGS) (e.g., a field-effect transistor (FET) 113), and a drain select gate (SGD) (e.g., FET 119). Each source select gate 113 is configured to selectively couple a respective NAND string 109 to a common source 123 responsive to a signal on source select line 117, while each drain select gate 119 is configured to selectively couple a respective NAND string to a respective bit line 107 responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local bit line 107-1 for the corresponding NAND string 109-1 at drain contact 121-1. The source of drain select gate 119 is connected to the drain of the last memory cell 111-N (e.g., a floating-gate transistor, of the corresponding NAND string 109-1).

In one or more embodiments, construction of non-volatile memory cells, 111-1, ..., 111-N, includes a source, a drain, a floating gate or other charge storage node, and a control gate. Non-volatile memory cells, 111-1, ..., 111-N, have their control gates coupled to a word line, 105-1, ..., 105-N respectively. A "column" of the non-volatile memory cells, 111-1, ..., 111-N, make up the NAND strings (e.g., 109-1, 109-2, 109-3, ..., 109-M), and are coupled to a given local bit line (e.g., 107-1, 107-2, 107-3, ..., 107-M), respectively. A "row" of the non-volatile memory cells are those memory cells commonly coupled to a given word line (e.g., 105-1, ..., 105-N). The use of the terms "column" and "row" is not meant to imply a particular linear (e.g., vertical and/or horizontal, orientation of the non-volatile memory cells). A NOR array architecture would be similarly laid out, except that the string of memory cells would be coupled in parallel between the select gates.

As one of ordinary skill in the art will appreciate, subsets of cells coupled to a target (e.g., selected) word line (e.g., 105-1, ..., 105-N), can be programmed and/or sensed (e.g., read) together as a group. During a program operation, a selected word line associated with the memory cells targeted for the program operation would receive a first voltage (e.g., a program voltage) designed to change the data state of memory cells associated with that word line if it is not program inhibited (e.g., via an inhibit voltage provided to the bit line to which the memory cell is coupled), while providing a second voltage (e.g., a pass voltage) to unselected/remaining word lines of the block designed to activate each memory cell associated with those word lines while not generating sufficient biasing to alter the program state of those memory cells, regardless of whether they are program inhibited. There are also other program operations in which various different biasing conditions (e.g., voltages) are used.

A sensing operation, such as a read or a program verify operation, can include sensing conduction of a bit line coupled to a selected cell (e.g., via a determined voltage and/or current change of the bit line) in order to determine the state of the selected cell. The sensing operation can involve providing a voltage to (e.g., driving) a bit line (e.g., bit line 107-1) associated with a selected memory cell above a voltage provided to a source (e.g., source line 123) associated with the selected memory cell. A sensing operation could alternatively include precharging the bit line 107-1 followed with discharge when a selected cell begins to conduct, and sensing the discharge.

As described further below in connection with FIG. 2, sensing the state of a selected cell can include providing (e.g., applying) a number of particular sensing voltages (e.g., a read voltages) to a selected word line while providing a read pass voltage, sufficient to place the unselected cells in a conducting state independent of the threshold voltage of the unselected cells, to the word lines coupled to the unselected cells of the string. The bit line corresponding to the selected cell being read and/or verified can be sensed to determine whether or not the selected cell conducts in response to the particular sensing voltages provided to the selected word line. As an example, the state of a selected cell can be determined based on the applied read voltage for which the bit line current reaches a particular reference current associated with a particular state.

As described further below in connection with FIGS. 2 and 3, a program verify operation can include providing a number of program verify voltages to a selected word line (e.g., after a programming pulse) to determine whether a memory cell coupled to the selected word line has reached a desired program state. In association with the program verify operation, a cache element can store a programming status of the selected memory cell (e.g., whether the selected memory cell has reached the desired program state). For example, the programming status of the selected memory cell can include one of programming complete and programming incomplete.

Prior to performing the program verify operation, the programming status of the selected memory cell can indicate that programming is incomplete. If the program verify operation determines that the selected memory cell has reached a desired program state, then the programming status (stored in the cache element) can be changed to indicate that programming is complete. Such a change in programming status can affect whether or not the selected memory cell will be program inhibited during subsequent programming pulse. For example, if the programming status stored in the cache element is programming incomplete, then the selected memory cell will not be program inhibited during a subsequent programming pulse provided to the selected word line. However, if the programming status stored in the cache element is programming complete, then the selected memory cell will be program inhibited during a subsequent programming pulse provided to the selected word line.

As discussed further herein, one or more embodiments of the present disclosure include using a voltage ramp as the read and/or verify voltage applied to a selected cell during read and/or program verify sensing operations. Providing a ramping voltage as the read voltage and/or verify voltage can provide benefits such as improved (e.g., decreased) sensing times and improved accuracy as compared to previous sensing approaches using several different discrete read and/or verify voltages during memory cell sensing operations.

Figure 2:
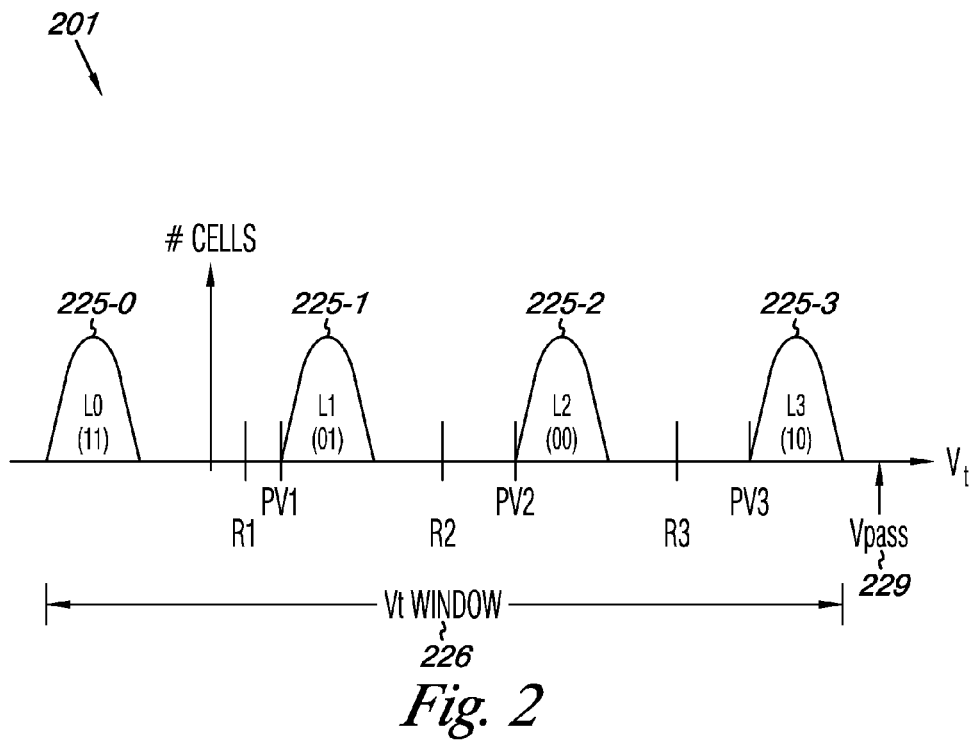
FIG. 2 illustrates threshold voltage (Vt) distributions within a Vt window as well as respective sensing voltages associated therewith.

FIG. 2 illustrates threshold voltage (Vt) distributions within a Vt window 226 as well as respective sensing voltages associated therewith. The example shown in FIG. 2 represents a two-bit (four-state) memory cells. The Vt distributions 225-0, 225-1, 225-2, and 225-3 represent four states (e.g., L0, L1, L2, and L3, respectively) to which memory cells can be programmed. State L0 can be referred to as an erased state and can correspond to binary data "11" restored by a memory cell. In this example, state L1 can correspond to data "01", state L2 can correspond to data "00", and state L3 can correspond to data "10". Embodiments of the present disclosure are not limited to the example illustrated in FIG. 2. For instance, embodiments are not limited to two-bit memory cells or to particular binary data assignments for the Vt distributions.

The example illustrated in FIG. 2 includes a number of read voltages R1, R2, and R3 that can be used during a sensing operation (e.g., a read operation) to determine to which state L0, L1, L2, and L3 a selected cell is programmed. The read voltages R1, R2, and R3 represent discrete voltages that can be used to distinguish between the different data states within Vt window 226. The Vt window 226 can have a magnitude of about 5-7 Volts (V), for instance. As an example, the Vt window can be from about −2V to about 5V or from −1V to 4V. As such, an increase in the number of data states within Vt window 226 can increase the number of read voltages required to distinguish between the different states, which can increase the time necessary to accurately determine the state of selected memory cells.

The example in FIG. 2 also includes a number of program verify voltages PV1, PV2, and PV3 that can be used during a sensing operation (e.g., a program verify operation) to determine if the Vt of a selected cell has reached a level corresponding to a target state, such that the cell will be inhibited from further programming. For instance, cells being programmed to target state L1 will be program inhibited when their Vt exceeds PV1. Similarly, cells being programmed to L2 will be program inhibited when their Vt exceeds PV2, and cells being programmed to L3 will be program inhibited when their Vt exceeds PV3.

Also shown in FIG. 2 is a read pass voltage 229 ("Vpass"). As noted above, a read pass voltage can be applied to unselected word lines during a sensing operation to place unselected cells in a conducting state. As such, the read pass voltage 229 is a voltage greater than a Vt associated with an uppermost program state (e.g., L3). When all cells in a string are in a conductive state, current can flow between the source tine contact at one end or the string and a drain line contact at the other end of the string. As such, the state of the selected cell can be determined based on sensed conduction on a bit line corresponding to a particular string when the selected cell begins to conduct. For example, the logical value of data stored in a selected cell can be determined based on whether the bit line current changes by a particular amount, or reaches a particular level within a given time period. Other types of sensing operations are possible as will be understood by one of ordinary skill in the art.

Figure 3:
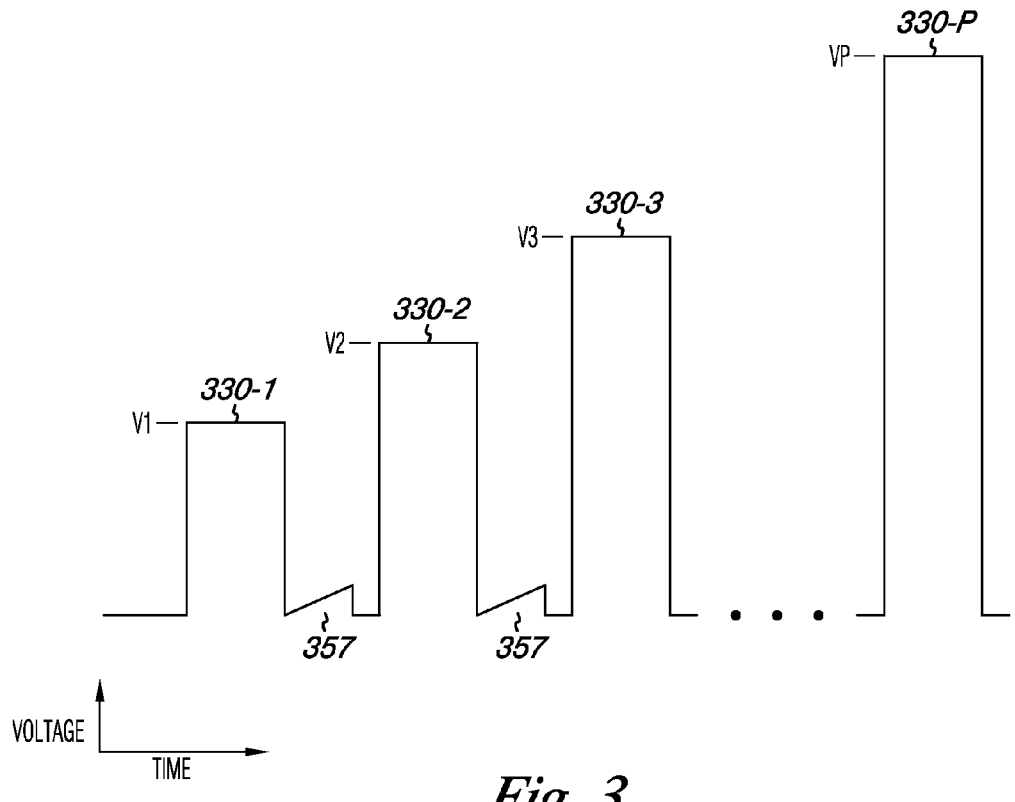
FIG. 3 illustrates a ramping voltage used in conjunction with a program verify operation in accordance with one or more embodiments of the present disclosure.

FIG. 3 illustrates a ramping voltage 357 used in conjunction with a program verify operation in accordance with one or more embodiments of the present disclosure. A program verify operation can include sensing a selected cell (e.g., 111-1, ..., 111-N in FIG. 1) after applying each of a number of program pulses (e.g., 330-1, 330-2, 330-3, ..., 330-P) to a selected word line. As illustrated in FIG. 3, the program pulses 330-1, 330-2, 330-3, ..., 330-P can be applied in series, with an increasing voltage level for each pulse (e.g., V1, V2, V3, ..., VP, as shown). Programming pulses are often applied within a fixed range of voltages (e.g., 16V to 20V). Programming pulses are applied to increase the Vt of the selected cell to a desired program voltage level (e.g., target state).

In order to determine when a selected cell has been programmed to the target state, a sensing operation (e.g., program verify operation) is performed between each programming pulse 330-1, 330-2, 330-3, ..., 330-P. In contrast to the example described in FIG. 2, in the embodiment illustrated in FIG. 3, the selected cell is sensed by applying a ramping voltage 357 (as opposed to one or more discrete program verify voltages such as PV1, PV2, and PV3 shown in FIG. 2) to the selected word line after each programming pulse 330-1, 330-2, 330-3, ..., 330-P to determine whether the selected cell has been programmed to the target state. As such, the ramping voltage 357 is a continuous (e.g., linear) ramping program verify voltage.

The use of ramping voltage 357 to sense a cell during a program verify operation can be advantageous over sensing methods using discrete sensing voltages, such as those described in FIG. 2, which can require applying a different distinct voltage level for each target program state. In contrast, use of a ramping voltage 357 can reduce the need for more complex circuitry and sensing time that would be required if the selected cell were verified using discrete program verify voltages for each of the number of program states to which the cell could be programmed.

Figure 4:
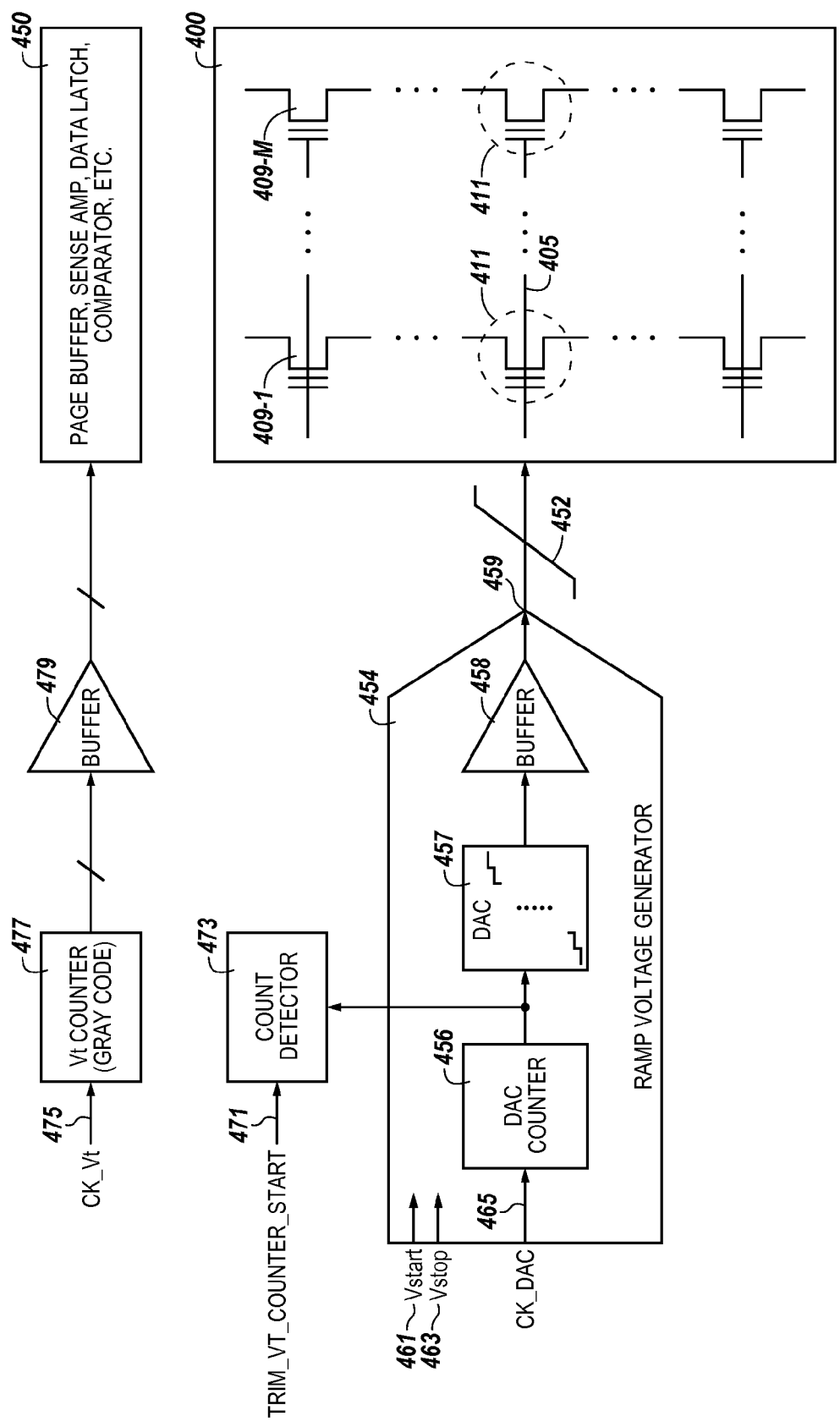
FIG. 4 illustrates a memory device in accordance with one or more embodiments of the present disclosure.

FIG. 4 illustrates a memory device in accordance with one or more embodiments of the present disclosure. The memory device illustrated in FIG. 4 includes a portion of an array 400. The array 400 can be an array of non-volatile memory cells such as array 100 described in FIG. 1. The memory device includes sensing circuitry 450. As illustrated in FIG. 4, and as described further below, the sensing circuitry 450 can include various components such as one or more page buffers, sense amps, data latches, and/or comparators, among other components that can be used in conjunction with sensing operations to determine a state of one or more selected cells (e.g., 411).

In one or more embodiments, the memory device includes a ramp voltage generator 454, which may also be referred to herein as a voltage ramp genertor. The output 459 of the voltage ramp generator 454 is a ramping voltage 452 that is applied to the control gate of a selected cell (e.g., 411) during a sensing operation (e.g., a read and/or program verify operation) in accordance with embodiments described herein. Although not shown in FIG. 4, the memory device can include a row decoder (e.g., decoder 644 shown in FIG. 6) used to provide the ramping voltage signal 542 to a selected word line (e.g., 405) based on received address signals. The ramp voltage generator 454 is configured to provide a ramping voltage 452 that changes linearly between a first voltage 461 (e.g., a lowermost voltage "Vstart") and a second voltage 463 (e.g., an uppermost voltage "Vstop").

In one or more embodiments, the ramp voltage generator 454 includes a first counting component 456, a digital-to-analog converter (DAC) 457, and a buffer 458 to provide the ramping voltage 452. As an example, the first counting component 456 can be a binary counter 456 having its output provided to the DAC 457. The counter 456 can receive a clock signal 465 ("CK_DAC") having a particular period, T (e.g., 1/frequency), associated therewith. As such, the DAC 457 can convert each digital input value from the counter 456 to a corresponding analog output voltage signal resulting in ramping voltage signal 452 to be applied to the control gate of one or more selected memory cells 411 (e.g., via selected word line 405) during a sensing operation. The output signal of the DAC 457 can be buffered by buffer 458 (e.g., a buffer amplifier such as a voltage buffer or current buffer). In this manner, the digital output of the counter 456 corresponds to the ramping voltage 452.

In one or more embodiments, and as illustrated in FIG. 4, the memory device includes a second counting component 477. The second counting component 477 can be a counter (e.g., a Gray Code counter 477 as shown) having its output signal provided to the sensing circuitry 450 (e.g., via a buffer amplifier 479). The sensing circuitry 450 is configured, during a sensing operation, to determine a present value of the output signal of the counter 477 in response to sensed conduction of the sense line (e.g., bit line) to which the selected cell (e.g., 411) is coupled. For instance, the present value of the output signal of the counter 477 (e.g., a digital value) can be latched in response to sensed conduction of the bit line to which the selected cell is coupled (e.g., the string 409-1, . . . , 409-M to which the selected cell 411 belongs). As an example, the present value of the output signal of the counter 477 can be latched in response to a tripping point of a sense amp being reached (e.g., when a current of 100 nA, for example, is sensed on the bit line of the selected cell).

The counter 477 is configured such that its output signal (e.g., each digital value) corresponds to a particular Vt level within a Vt window (e.g., Vt window 226 shown in FIG. 2) associated with the memory cells. As described further in connection with FIG. 5, the memory device can be configured such that an initial output value of the counter 477 corresponds to a lowermost voltage level of the Vt window and such that a final output value of the counter 477 corresponds to an uppermost voltage level of the Vt window. In this manner, the latched value of the output from counter 477 can correspond to a particular Vt level of the selected cell and/or to a particular data state of the selected cell. As an example, the counter 477 can be an N-bit counter corresponding to $2^N$ Vt levels within the Vt window. The latched value of the output from counter 477 can also include soft data (e.g., one or more of the "N" bits can correspond to soft data associated with the selected memory cell).

As illustrated in FIG. 4, the counter 477 can receive a clock signal 475 ("CK_Vt"). As described below in FIG. 5, the period of clock signal 475 can be adjusted to align an uppermost count of counter 477 with the uppermost Vt level associated with the Vt window (e.g., Vt window 526 shown in FIG. 5).

The memory device illustrated in FIG. 4 includes a count detection component 473. The output of the counter 456, which may be referred to herein as the "first counter," can be provided to the count detection component 473. The count detection component 473 can also provide a count initialization signal to the counter 477, which may be referred to herein as the "second counter." The count detection component 473 can be configured to provide the count initialization signal to the second counter 477 in response to the output value of the first counter 456 reaching a particular value, which can correspond to a desired lowermost Vt level of the Vt window associated with the memory cells, as described further below. As illustrated in FIG. 4, a trim signal 471 ("TRIM_VT_COUNTER_START) is provided to the count detection component 473. The trim signal 471 indicates the output value of the first counter 456 for which the count detection component 473 is to provide the count initialization signal to the second counter 477.

As described further below in connection with FIG. 5, a memory device that includes a counter (e.g., first counter 456) whose output corresponds to a ramping voltage applied to a selected word line and includes a separate counter (e.g., second counter 477) whose output can be latched by sensing circuitry in response to sensed conduction of a bit line (e.g., in response to the ramping voltage applied to the selected word line reaching a level which causes a selected cell to conduct) in accordance with embodiments described herein can provide various benefits. For example, the use of a separate counters allows for different resolutions associated with the counter (e.g., 456) whose output corresponds to the ramping voltage 452 and with the counter (e.g., 477) whose output is latched by the sensing circuitry 450 and which corresponds to a Vt level of the selected cell. Providing for differing resolutions can provide benefits such as reducing the number of sensing components associated with sensing circuitry 450 while maintaining a suitable resolution associated with ramping voltage 452.

As an example, the first counter 456 can be an 8-bit counter used to provide a suitable ramping voltage 452, and the second counter 477 can be a 7-bit counter used to provide suitable resolution for the Vt window associated with the memory cells. As such, the sensing circuitry 450 may include 7 data latches (e.g., one data latch for each of the 7 bits output by the counter 477). Increasing the resolution associated with the Vt window (e.g., by making counter 477 an 8-bit counter), would include providing sensing circuitry having 8 data latches to latch the output of the counter 477 (e.g., 8 data latches instead of 7 for each of the "M" bit lines 409-1, . . . , 409-M). As such, there is a tradeoff between increased resolution associated with the Vt window and increased foot print (e.g., die size) associated with the memory device. If separate counters corresponding to the ramping voltage 452 and the Vt window are not implemented in the memory device illustrated in FIG. 4 (e.g., if the embodiment illustrated in FIG. 4 included a single 8-bit counter whose output was applied to DAC 457 and to sensing circuitry 450), then the resolutions associated with the Vt window and with the ramping voltage would be the same, which could result in a number of drawbacks.

As an example, the resolution associated with the Vt window (e.g., Vt window 526 shown in FIG. 5) would be compromised (e.g., reduced) due to overhead associated with ends of the ramping voltage 452 (e.g., due to non-linearity at the start and stop of the ramping voltage caused by RC transient effect of the word lines). For instance, the lowermost Vt level and the uppermost Vt level of the Vt window would be placed away from the ends of the ramping voltage to avoid such non-linearity.

As illustrated in FIG. 4, since the counters 456 and 477 are separate counters, they can be different types of counters. For instance, in this example, the Vt counter 477 is a gray code counter and the DAC counter 456 is a binary counter. As one of ordinary skill in the art will appreciate, a gray code counter is a counter for which successive values differ by a single bit. Providing a gray code counter as the Vt counter 477 can provide various benefits. For instance, the output of the gray code counter 477 can be less susceptible to electrical noise and can have a lower peak current associate therewith, as compared to a binary up counter, for example. The gray code counter 477 can also provide an improved (e.g., reduced) raw bit error rate (rber) associated with sensing memory cells, as compared to a binary counter, for example. However, embodiments of the present disclosure are not limited to a particular type of first counter 456 and/or second counter 477.

Figure 5:
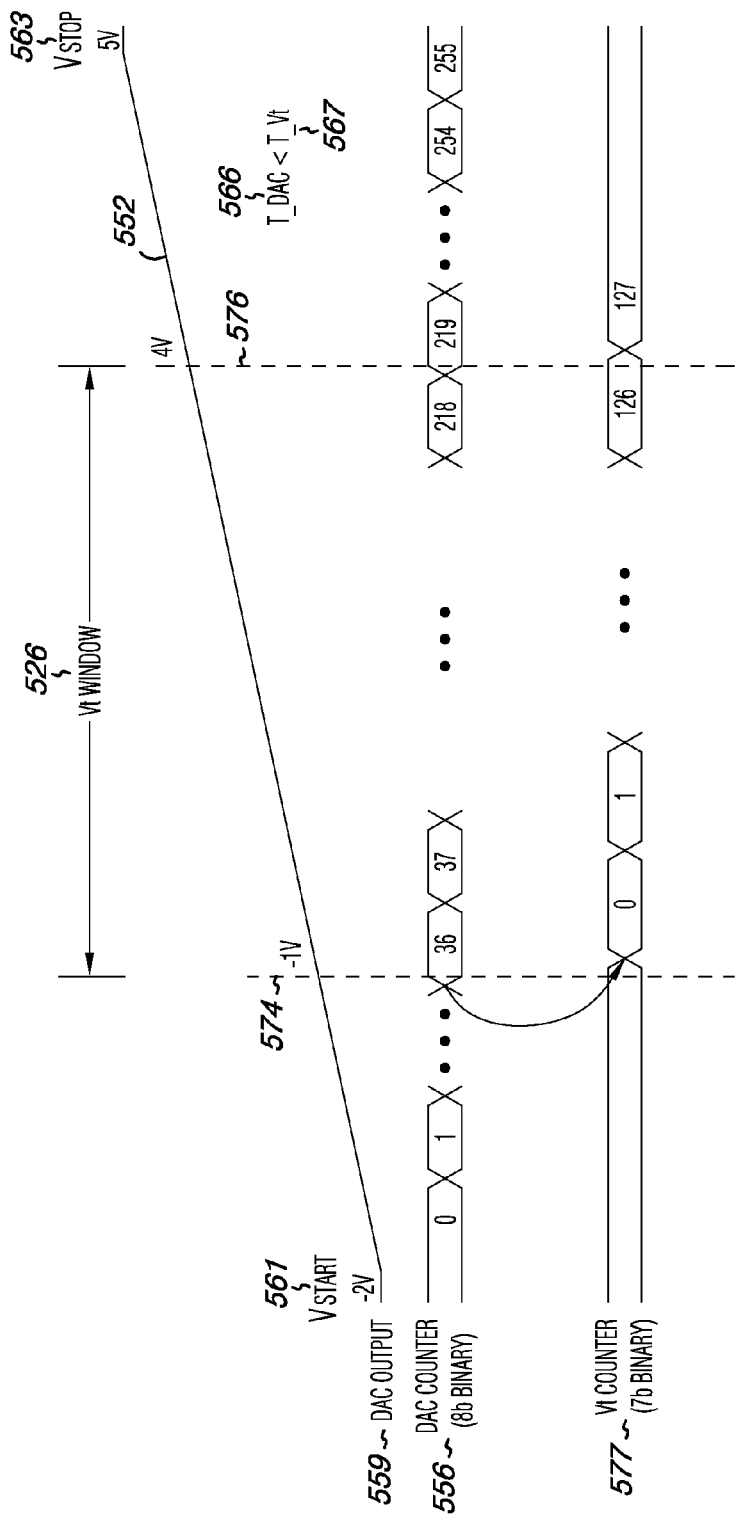
FIG. 5 illustrates a ramping voltage in accordance with one or more embodiments of the present disclosure.

FIG. 5 illustrates a ramping voltage 552 in accordance with one or more embodiments of the present disclosure. As described above, ramping voltage 552 can be a sensing voltage (e.g., a read or program verify voltage) applied to the control gate of selected memory cells during sensing operations. The ramping voltage 552 is provided by the output 559 of a digital-to-analog converter (e.g., DAC 457 illustrated in FIG. 4), based on digital values output from a first counter 556. In this example, the ramping voltage 552 has a start voltage 561 (Vstart) of −2V and a stop voltage 563 (Vstop) of 5V. As such, the values output from the first counter 556 correspond to a ramping voltage between Vstart and Vstop. In this example, the first counter is an 8-bit (8 b) binary counter such that $2^8$ (256) digital values are used to provide the ramping voltage 552.

As described above, the output of a second counter (e.g., 477 of FIG. 4) can be provided to sensing circuitry (e.g., 450 of FIG. 4), and the output of the second counter can be latched by the sensing circuitry in response to sensed conduction of the bit line corresponding to a selected memory cell. The latched output of the second counter correlates to a Vt level of the selected cell being sensed. As illustrated in FIG. 5, the Vt counter 577 (e.g., second counter) is configured such that its initial output value corresponds to a lowermost Vt level 574 (e.g., −1V) of the Vt window 526 and its final output value corresponds to an uppermost Vt level 576 (e.g., 4V) of the Vt window 526. In this example, the Vt Counter 577 is a 7-bit (7 b) counter such that $2^7$ (128) digital values correspond to Vt levels of selected cells within the Vt window 526. That is, each binary output (e.g., 0000000, 0000001, . . . , 1111111) of the 7-bit Vt counter 577 correlates to a Vt level of a selected memory cell between −1V and 4V, in this example. As such, when the data output by the Vt counter 577 is latched in response to sensed conduction of the bit line of the selected cell, the latched data value can be mapped to a particular Vt level of the selected cell being sensed (e.g., during a read and/or program verify operation).

As noted above, in one or more embodiments, the second counter (e.g., Vt Counter 577) can be configured to begin counting based, at least partially, on a particular output value of the first counter (e.g., DAC Counter 556). For instance, in the embodiment illustrated in FIG. 5, the count of the Vt Counter 577 begins (e.g., clock pulse "0" of Vt Counter 577) occurs at clock pulse "36" of the DAC counter 556. In the embodiment illustrated in FIG. 5, the DAC Counter 556 and the Vt Counter 577 are configured to receive clock signals (e.g., 465 and 475 as shown in FIG. 4) having different periods associated therewith. For instance, in this example the period ("T_DAC") associated with the DAC Counter 556 is less than the period ("T_Vt") associated with the Vt Counter 577. However, in one or more embodiments, the different clock signals T_DAC and T_Vt are derived from the same clock source.

In the embodiment illustrated in FIG. 5, the first counter 556 and the second counter 577 are both binary counters (e.g., binary up counters). However, embodiments are not limited to this example. For instance, in one or more embodiments, the counter 556 can be a binary counter and the counter 577 can be a gray code counter (e.g., as described above in connection with FIG. 4).

Figure 6:
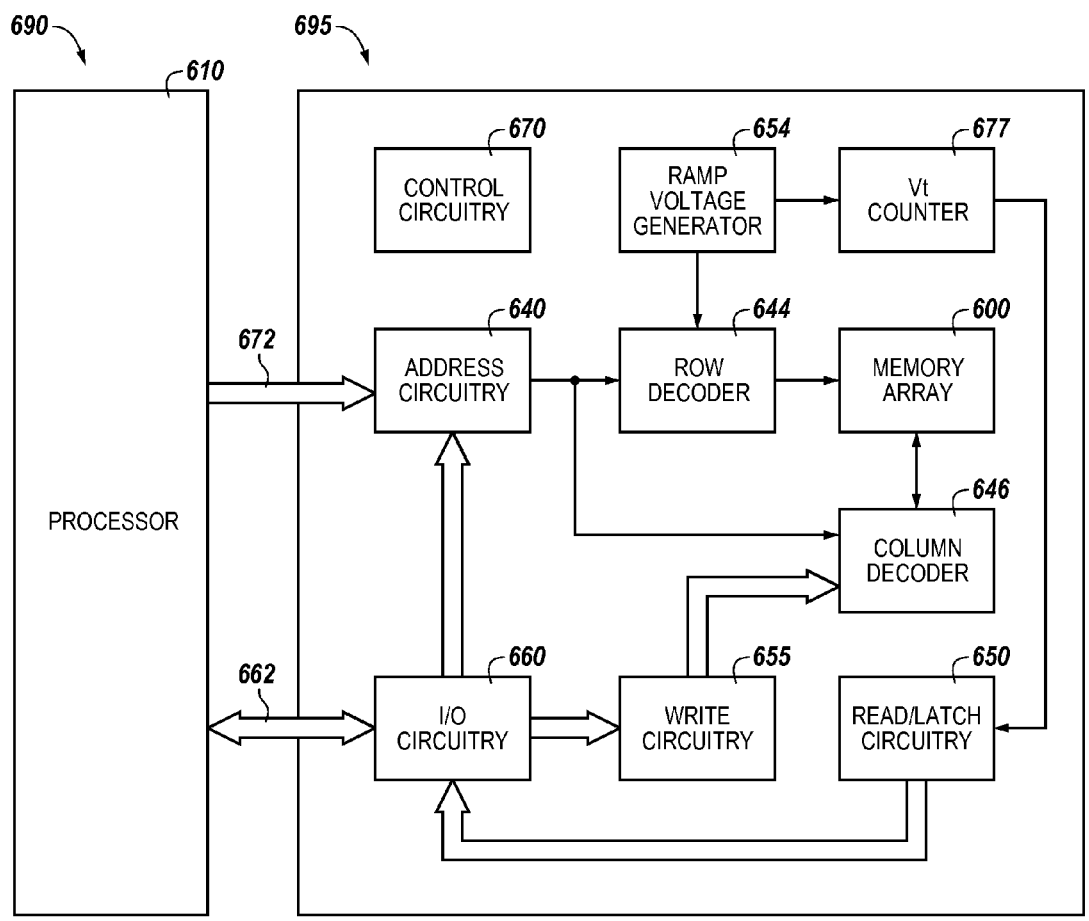
FIG. 6 illustrates a memory system in accordance with one or more embodiments of the present disclosure.

FIG. 6 illustrates a memory system in accordance with one or more embodiments of the present disclosure.

FIG. 6 is a functional block diagram of an electronic memory system 690 having at least one memory device 695 in accordance with one or more embodiments of the present disclosure. Memory system 690 includes a processor 610 coupled to a non-volatile memory device 695 that includes a memory array 600. The memory array 600 can include multilevel non-volatile cells. The memory system 690 can include separate integrated circuits or both the processor 610 and the memory device 695 can be on the same integrated circuit. The processor 610 can be a microprocessor or some other type of controlling circuitry such as an application-specific integrated circuit (ASIC).

The memory device 695 includes an array 600 of non-volatile memory cells, which can be floating gate flash memory cells with a NAND architecture. The control gates of each row of memory cells are coupled with a word line, while the drain regions of the memory cells are coupled to bit lines. The source regions of the memory cells are coupled to source lines, as the same has been illustrated in FIG. 1. As will be appreciated by those of ordinary skill in the art, the manner of connection of the memory cells to the bit lines and source lines depends on whether the array is a NAND architecture, a NOR architecture, and AND architecture, or some other memory array architecture.

The embodiment of FIG. 6 includes address circuitry 640 to latch address signals provided over I/O connections 662 through I/O circuitry 660. Address signals are received and decoded by a row decoder 644 and a column decoder 646 to access the memory array 600. In light of the present disclosure, it will be appreciated by those skilled in the art that the number of address input connections depends on the density and architecture of the memory array 600 and that the number of addresses increases with both increased numbers of memory cells and increased numbers of memory blocks and arrays.

The memory device 695 senses data in the memory array 600 by sensing voltage and/or current changes in the memory array columns using sense/buffer circuitry that in this embodiment can be read/latch circuitry 650. The read/latch circuitry 650 can read and latch a page or row of data from the memory array 600.

The memory device 695 includes a ramp voltage generator 654 (e.g., ramp voltage generator 454 shown in FIG. 4) that can provide a ramping voltage to a selected word line during sensing operations. As described above, the ramp voltage generator 654 can include a first counter (e.g., DAC Counter 456 shown in FIG. 4) whose output can be provided to a DAC. The memory device 695 also includes a Vt Counter 677 (e.g., Vt Counter 477 shown in FIG. 4). The output of the Vt Counter 677 can be provided to the read/latch circuitry 650 and the present value of the Vt Counter 677 can be latched by circuitry 650 in response to sensed conduction of the bit line of a selected cell of array 600 during a sensing operation.

I/O circuitry 660 is included for bi-directional data communication over the I/O connections 662 with the processor 610. Write circuitry 655 is included to write data to the memory array 600.

Control circuitry 670 decodes signals provided by control connections 672 from the processor 610. These signals can include chip signals, write enable signals, and address latch signals that are used to control the operations on the memory array 600, including data sensing, data write, and data erase operations. In some embodiments, the control circuitry 670 is responsible for executing instructions from the processor 610 to perform the operations according to embodiments of the present disclosure. The control circuitry 670 can be a state machine, a sequencer, or some other type of controller. It will be appreciated by those skilled in the art that additional circuitry and control signals can be provided, and that the memory device detail of FIG. 6 has been reduced to facilitate ease of illustration.

CONCLUSION

The present disclosure includes methods, devices, and systems for sensing memory cells. One or more embodiments include providing an output of a first counter to a digital-to-analog converter (DAC). An output of the DAC can correspond to a ramping voltage applied to a control gate of the memory cell. An output of a second counter can be provided to sensing circuitry coupled to a sense line of the memory cell. Conduction of the sense line in response to the ramping voltage can be sensed, and an output value of the second counter can be determined in response to the sensed conduction of the sense line.

It will be understood that when an element is referred to as being "on" "connected to" or "coupled with" another element, it can be directly on, connected, or coupled with the other element or intervening dements may be present. In contrast, when an element is referred to as being "directly on," "directly connected to" or "directly coupled with" another element, there are no intervening elements or layers present. As used herein, the term "and/or" includes any and all combinations of one or more of the associated listed items.

As used herein, the term "and/or" includes any and all combinations of one or more of the associated listed items. As used herein the term "or," unless otherwise noted, means logically inclusive or. That is, "A or B" can include (only A), (only B), or (both A and B). In other words, "A or B" can mean "A and/or B" or "one or more of A and B."

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be, understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for sensing a memory cell, comprising:
   providing an output of a first counter to a digital-to-analog converter (DAC), an output of the DAC corresponding to a ramping voltage provided to a control gate of the memory cell;
   providing an output of a second counter to sensing circuitry coupled to a sense line of the memory cell;
   sensing conduction of the sense line in response to the ramping voltage; and
   determining an output value of the second counter in response to the sensed conduction of the sense line.

2. The method of claim 1, wherein providing the output of the first counter to the DAC includes applying an output of a binary counter to the DAC.

3. The method of claim 2, wherein providing the output of the second counter to the sensing circuitry includes providing the output of a gray code counter to the sensing circuitry.

4. The method of claim 1, including latching the output value of the second counter in response to the sensed conduction of the sense line.

5. The method of claim 1, wherein each output value of the second counter corresponds to a threshold voltage (Vt) within a Vt window associated with the memory cell.

6. The method of claim 5, wherein a count of the second counter is configured to begin counting in response to a count of the first counter reaching a particular value.

7. The method of claim 6, wherein the particular value of the first counter corresponds to a lowermost Vt of the Vt window.

8. The method of claim 5, wherein a last output value of the second counter corresponds to an uppermost Vt of the Vt window.

9. A method for sensing a memory cell, comprising:
   providing a ramping voltage to a control gate of a memory cell, wherein the ramping voltage is provided by a ramp voltage generator configured to convert digital values output from a first counter to an analog voltage signal;
   providing an output of a second counter to sensing circuitry coupled to a sense line of the memory cell, wherein each output value of the second counter corresponds to a particular threshold voltage;
   sensing conduction of the sense line in response to the provided ramping voltage; and
   determining the output value of the second counter corresponding to the sensed conduction of the sense line.

10. The method of claim 9, wherein the method includes beginning a count of the second counter based, at least partially, on a particular output value of the first counter.

11. The method of claim 9, wherein the method includes latching the output value of the second counter in response to reaching a tripping point of a sense amp.

12. The method of claim 9, wherein the method includes:
   providing a first clock signal to the first counter; and
   providing a second clock signal to the second counter;
   wherein a period of the first clock signal is different than a period of the second clock signal.

13. The method of claim 12, wherein providing the first clock signal and the second clock signal includes providing the first clock signal having a period that is less than a period of the second clock signal.

14. The method of claim 12, wherein the method includes adjusting the period of the second clock signal to align an uppermost count of the second counter with an uppermost Vt associated with the Vt window associated with the memory cell.

15. The method of claim 9, including converting the digital values output from the first counter to the analog voltage signal by using a digital-to-analog converter (DAC).

16. A memory device, comprising:
a first counting component having an output signal corresponding to a ramping voltage provided to a control gate of a selected memory cell during a sensing operation;
sensing circuitry coupled to a sense line coupled to the selected memory cell, the sensing circuitry configured to sense conduction of the sense line in response to the ramping voltage provided to the control gate of the selected memory cell; and
a second counting component having an output signal provided to the sensing circuitry;
wherein the sensing circuitry is configured to determine a present value of the output signal of the second counting component in response to sensed conduction of the sense line.

17. The device of claim 16, wherein the device includes a digital-to-analog converter (DAC) that receives the output signal of the first counting component and provides the ramping voltage based thereon.

18. The device of claim 16, wherein the device includes a count detection component that receives the output signal of the first counting component, and wherein the count detection component provides a count initialization signal to the second counting component in response to the output signal of the first counting component reaching a particular value.

19. The device of claim 18, wherein the particular value corresponds to a lowermost threshold voltage (Vt) of a Vt window associated with the selected memory cell.

20. The device of claim 16, wherein the sensing operation is a program verify operation.

21. The device of claim 16, wherein the first counting component is a binary counter and the second counting component is a gray code counter.

22. The device of claim 16, wherein the determined present value of the output signal of the second counting component corresponds to a particular sensed data state of the selected memory cell.

23. A memory device, comprising:
a ramp voltage generator configured to provide a ramping voltage to a control gate of a selected memory cell during a sensing operation, wherein the ramp voltage generator includes a first counter having an output provided to a digital-to-analog converter; and
a second counter having an output provided to sensing circuitry coupled to a sense line coupled to the selected memory cell;
wherein the sensing circuitry is configured to:
sense conduction of the sense line in response to the ramping voltage provided to the control gate of the selected memory cell; and
latch a present output value of the second counter when conduction of the sense line is sensed.

24. The device of claim 23, wherein the latched present output value of the second counter corresponds to a threshold voltage (Vt) level of the selected memory cell.

25. The device of claim 23, wherein the latched present output value of the second counter includes soft data associated with the selected memory cell.

26. The device of claim 23, wherein the first counter is configured to receive a first clock signal and the second counter is configured to receive a second clock signal, and wherein a period of the second clock signal is greater than a period of the first clock signal.

27. The device of claim 23, wherein the selected memory cell is a flash memory cell.

28. The device of claim 23, wherein a resolution of the first counter is different than a resolution of the second counter.

29. The device of claim 23, wherein the first counter is an N-bit counter and the second counter is an M-bit counter, and wherein M is less than N.

* * * * *